United States Patent [19]

Schempp et al.

[11] Patent Number: 4,834,662
[45] Date of Patent: May 30, 1989

[54] METHOD AND ARRANGEMENT FOR THE CONNECTION OF A MULTIPOLE CONNECTOR TO A CIRCUIT BOARD

[75] Inventors: Otto Schempp, Bad Rappenau; Werner Grunow, Heilbronn-Biberach, both of Fed. Rep. of Germany

[73] Assignee: Winchester Electronics, Subsidiary of Litton Precision Products International GmbH, Heilbronn-Biberach, Fed. Rep. of Germany

[21] Appl. No.: 158,832
[22] Filed: Feb. 22, 1988

[30] Foreign Application Priority Data

Feb. 25, 1987 [EP] European Pat. Off. ........ 87102643.1

[51] Int. Cl.⁴ ............................................. H01R 9/09
[52] U.S. Cl. ...................................... 439/83; 29/839; 361/400; 439/876
[58] Field of Search .................... 439/79–85, 439/55, 874–876; 29/839, 840, 843; 361/400–405

[56] References Cited

U.S. PATENT DOCUMENTS

| | | | |
|---|---|---|---|
| 3,541,225 | 11/1970 | Raciti | 174/68.5 |
| 3,710,196 | 1/1973 | Fifield | 439/83 |
| 3,832,603 | 8/1974 | Cray et al. | 439/876 |
| 4,637,135 | 1/1987 | Grabbe | 439/83 |
| 4,755,631 | 7/1988 | Churchwell | 29/840 |

OTHER PUBLICATIONS

IBM Bulletin, Martyak, vol. 14, No. 8, p. 2297, 1–1972.

Primary Examiner—Eugene F. Desmond
Attorney, Agent, or Firm—Brian L. Ribando

[57] ABSTRACT

The method and the arrangement for the connection of a multipole connector to a circuit board (1), specifies that the circuit board (1) is provided with a plurality of blind holes (3), equivalent in number to and matching the location of terminals (4) extending out of the connector housing (2). The blind holes (3) are filled with solder paste (5) and the mechanical and electrical connection of the connector (2) with the circuit board (1) is carried out by reflowing the solder paste. Compared with the conventional technique utilizing through-drilled connection holes, the invention provides the advantage that conductor paths can be routed underneath the blind holes, soldering paste cannot get on the underside of the circuit board, and a tolerance compensation of the lengths of the terminals is insured without subjecting the circuit board to preload forces exerted by the terminals.

8 Claims, 1 Drawing Sheet

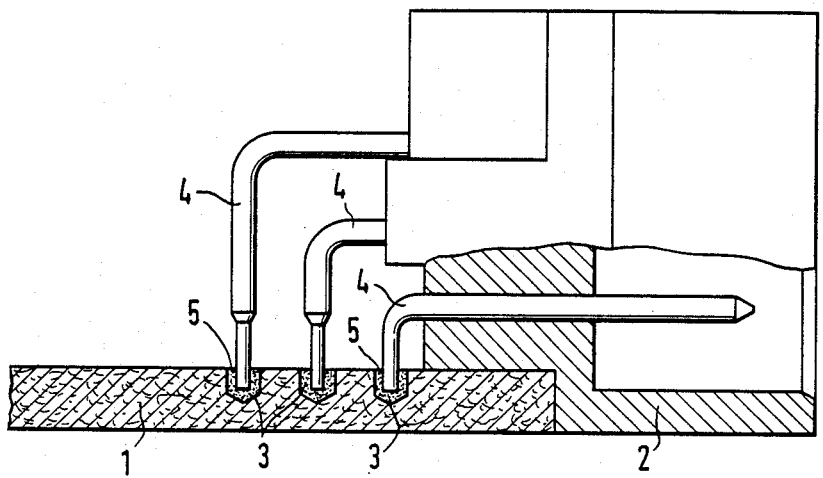

METHOD AND ARRANGEMENT FOR THE CONNECTION OF A MULTIPOLE CONNECTOR TO A CIRCUIT BOARD

BACKGROUND OF THE INVENTION

The invention relates to a method and apparatus for coupling the terminals of a multipole connector to a circuit board.

Up until now, connectors, for example 96-pole connectors or the like, have usually been coupled to circuit boards by soldering the connector terminals to plated through holes in the circuit board. However, new surface connection techniques give rise in particular to the problems discussed below for the connection of such connectors. The bonding of electronic components and the like may be carried out by a type of bonding known as "surface mount" by means of so-called gull wings or "J" wings, not requiring any wave soldering; instead, soldering is performed by a reflow of soldering paste which has been previously deposited. If the customary form of hole bonding is utilized for the connection of a normal connector, this gives rise to the necessity, which is undesirable from the production point of view, that a so-called solder wave is required just for the connector terminals. This is obviously undesirable in a manufacturing process.

In order to avoid wave soldering, it has already been proposed to attach the connectors mechanically, for example by riveting, in the edge region and to allow the terminals to rest more or less freely, with just a slight contact pressure, on the intended contact points of the circuit board and to carry out bonding by the reflow solder method. However, this may also entail difficulties in that the many contacts do not necessarily rest with precisely the same preload pressure on the intended contact points. For instance, it is possible that one metal lead rests on its contact point with a relatively high pressure and another is not in contact at all, so that absolute contact reliability cannot be insured. If, on the other hand, the terminals of a multipole connector are provided with a certain resilient preload, it may easily happen that the circuit board is distorted slightly by the preload pressure exerted by the terminals, for example by 0.3 to 1 mm. This means that the desirable easy insertion of a circuit board into its intended position is no longer guaranteed.

SUMMARY AND OBJECTS OF THE INVENTION

The invention is therefore based on the desire of creating a means of connection for connectors which makes it possible to couple the connector to a circuit board by the solder reflow method, in other words without wave soldering, but nevertheless to guarantee a reliable connection and ensure a force-free tolerance compensation for the position of the connector terminal ends.

The method according to the invention for the connection of a multipole connector, preferably to the edge region of a circuit board utilizes a plurality of blind holes which do not extend completely through the circuit board and which are equivalent in number to and matching the location of the terminals extending out of the connector housing. The blind holes are filled with solder paste, the connector housing is positioned relative to the circuit board in such a way that the free ends of the terminals project into the blind holes, and the mechanical and electrical connection of the terminals to the circuit board is carried out by a reflow soldering method.

The main advantages of the type of connection according to the invention compared with the conventional technique utilizing plated through holes which extend completely through the circuit board may be briefly summarized as follows:

1. Conductor paths may be routed on the bottom of the circuit board underneath the blind holes.
2. The solder paste cannot escape from the bottom of the blind holes; rather, a sure supply of solder and thus satisfactory bonding is insured.
3. Compared with the customary surface mount terminals (gull wings or "J" wings), a greater tolerance range of the lengths of the terminals is possible without subjecting the circuit board to preload forces, which is particularly advantageous in the case of large multipole connectors.

It is accordingly an object of the invention to provide a terminal connection arrangement between a multipole connector and a circuit board characterized in that the circuit board is provided with a plurality of blind holes, equivalent in number to and matching the location of the terminals extending out of the connector housing wherein the ends of the terminals project into the blind holes and are soldered by a reflow soldering technique.

An exemplary embodiment of the invention will be explained in more detail below with reference to the drawing figure.

BRIEF DESCRIPTION OF THE DRAWING

The FIGURE shows an end view, partly in section, of a terminal connection arrangement between a multipole connector adn a circuit board according to the invention.

DESCRIPTION OF THE PREFERRED EMBODIMENT

The FIGURE shows a connector housing 2 which is mated to the edge region of a circuit board 1 (positively fitted in the example shown). Protruding laterally from the connector housing 2 in the example shown are three rows of terminals 4, which are bent downwardly in the direction of the circuit board as shown. The circuit board 1 is provided with a plurality of blind holes 3 equivalent to the number of terminals 4. Each of the blind holes 3 contains a quantity of soldering paste 5. The connector housing is mounted in the correct position on the circuit board 1, so that the free ends of the bent terminals 4 project into the blind holes 3. The free ends of the terminals 4 can be soldered together with all other electronic and electrical components and modules (not shown) on the circuit board 1 using the reflow solder method.

From a manufacturing point of view, the invention offers clear cost advantages and ensures a reliable mechanical and electrical connection between the circuit board 1 and connector housing 2 without any fear of the circuit board being deformed, since the free ends of the terminals 4 project into the blind holes 3 but are not required to exert a preload force on the circuit board.

Having thus described the invention, various alterations and modifications will be apparent to those skilled in the art, which alterations and modifications are intended to be within the scope of the invention as defined by the appended claims.

What is claimed is:

1. The method of coupling the terminal ends of a multipole connector to a circuit board, the multipole connector having forwardly extending contacts positioned for connection to a mating connector member, the rear ends of the contacts forming said terminal ends, the terminal ends being arranged to become preloaded against a planar surface of the circuit board when the connector is assembled thereto, the method comprising the steps of:
    (a) providing a plurality of blind holes in the circuit board equivalent in number to and matching the location of the terminal ends, the blind holes being formed to avoid preloading of the terminal ends;
    (b) providing a quantity of solder paste in each of the blind holes;
    (c) positioning the multipole connector to locate the terminal ends one each in the blind holes; and
    (d) reflowing the solder in each of the blind holes to couple the terminal ends to the blind holes.

2. A structure on a circuit board for receiving the terminal ends of a multipole connector, the multipole connector having forwardly extending contacts positioned for connection to a mating connector member, the rear ends of the contacts forming said terminal ends, the terminal ends being arranged to become preloaded against a planar surface of the circuit board when the connector is assembled thereto, the structure comprising:
    a plurality of blind holes formed in the circuit board, said blind holes being equivalent in number to and matching the location of the terminal ends, said blind holes being formed to avoid preloading of the terminal ends.

3. The structure of claim 2 further comprising: a quantity of solder in each blind hole.

4. The structure of claim 3 wherein the solder is reflow solder paste.

5. A coupling arrangement between a multipole connector having a plurality of terminal ends and a circuit board, the multipole connector having forwardly extending contacts positioned for connection to a mating connector member, the rear ends of the contacts forming said terminal ends, the terminal ends being arranged to become preloaded against a planar surface of the circuit board when the connector is assembled thereto, the coupling arrangement comprising:
    a plurality of blind holes formed in the circuit board; and
    a quantity of solder in each blind hole, wherein each terminal end is located in a blind hole to avoid preloading of the terminal ends, and the solder provides bonding between the terminal ends and the circuit board.

6. The coupling arrangement of claim 5 wherein the blind holes are equivalent in number and matching in location to the terminal ends.

7. The coupling arrangement of claim 6 wherein the solder is reflow solder.

8. The coupling arangement of claim 6 wherein the rest position of the terminal ends is below the surface of the circuit board when the multipole connector is mounted on the circuit board.

* * * * *